US009722356B2

(12) United States Patent
Hashiguchi

(10) Patent No.: US 9,722,356 B2
(45) Date of Patent: Aug. 1, 2017

(54) CONNECTOR

(71) Applicant: Japan Aviation Electronics Industry, Limited, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 15/220,945

(22) Filed: Jul. 27, 2016

(65) Prior Publication Data

US 2017/0141513 A1 May 18, 2017

(30) Foreign Application Priority Data

Nov. 13, 2015 (JP) ................................ 2015-222673

(51) Int. Cl.

*H01R 12/00* (2006.01)
*H05K 1/00* (2006.01)
*H01R 13/639* (2006.01)
*H01R 12/71* (2011.01)
*H01R 13/655* (2006.01)
*H01R 12/79* (2011.01)

(52) U.S. Cl.

CPC ......... *H01R 13/639* (2013.01); *H01R 12/716* (2013.01); *H01R 12/79* (2013.01); *H01R 13/655* (2013.01)

(58) Field of Classification Search

CPC ..... H01R 13/639; H01R 13/655; H01R 12/79
USPC ...................................... 439/83, 76.1, 79, 80
See application file for complete search history.

(56) References Cited

U.S. PATENT DOCUMENTS 9,033,732 B2 * 5/2015 Hashiguchi ............ H01R 4/182 439/581
9,209,533 B2 * 12/2015 Hashiguchi .......... H01R 9/0518

FOREIGN PATENT DOCUMENTS

JP 2011-249206 A 8/2011

* cited by examiner

*Primary Examiner* — Javaid Nasri
(74) *Attorney, Agent, or Firm* — Muncy, Geissler, Olds & Lowe, P.C.

(57) ABSTRACT

A connector includes a ground frame, an insulator held by the ground frame and having a connection target housing portion, a contact having a contact portion and held by the insulator such that the contact portion is exposed at the connection target housing portion, and a cover member held by the ground frame to be rotatable between an open position and a closed position and having a cover member side locking portion, the ground frame having a projection that is fitted to a positioning shaped portion of the connection end of the connection target, when the connection end is housed in the connection target housing portion, to position the connection target and that catches on the cover member side locking portion, when the cover member is in the closed position, to lock the cover member in the closed position.

14 Claims, 10 Drawing Sheets

FIG. 24
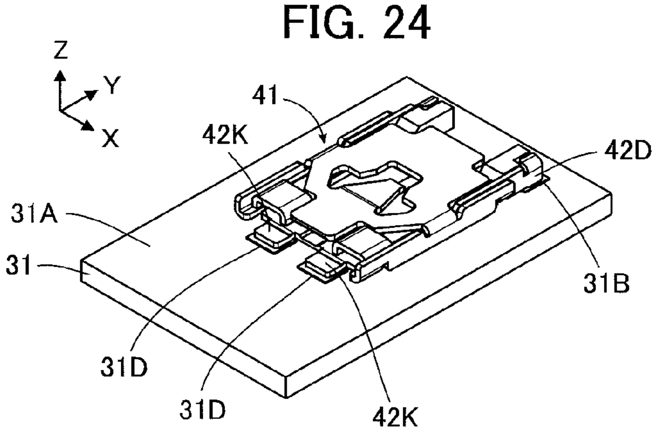
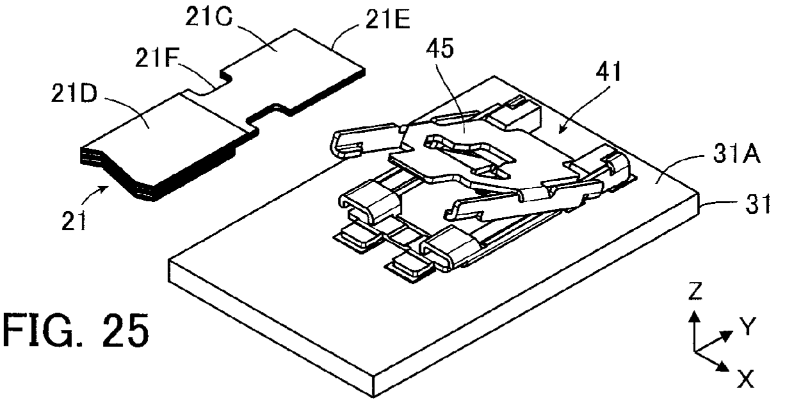
FIG. 25
FIG. 26
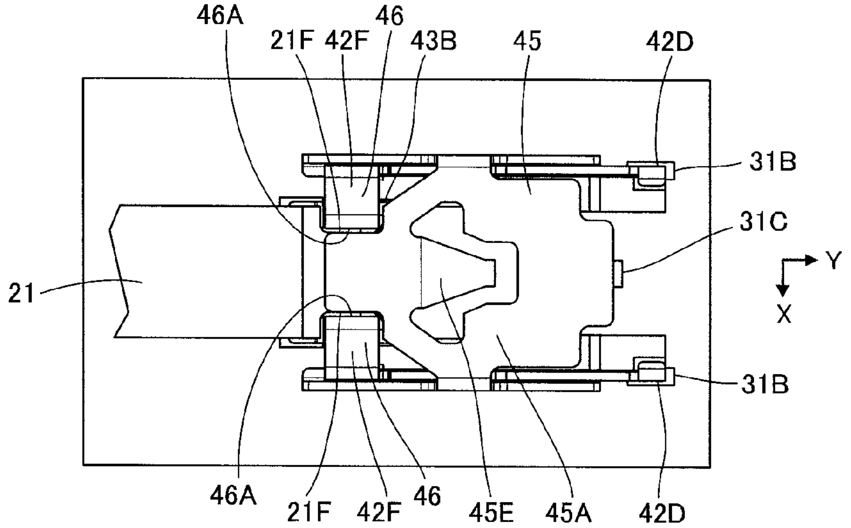

CONNECTOR

BACKGROUND OF THE INVENTION

The present invention relates to connectors, particularly to a connector serving to establish a connection with a connection target that comprises a plate- or sheet-like base having a surface on which a conductor pattern is disposed, such as a flexible printed circuit (FPC), a flexible flat cable (FFC) or a rigid circuit board.

As a connector of this type, for example, JP 2011-249206 A discloses a connector 2 that establishes a connection with a connection target 1 as shown in FIG. 30. The connection target 1 has at its end a connector fitted piece 3 and at its opposite lateral edges cutouts 4 used for positioning. At a connector body 5 of the connector 2, there are formed an insertion recess 6 for receiving the connector fitting piece 3 and projections 7 corresponding to the cutouts 4 of the connection target 1. The connector 2 also includes a metal shell 8 rotatably attached to the connector body 5 and metal fixing parts 9 disposed above the projections 7.

With the shell 8 being stood upright so that the top of the connector body 5 is open, the connector fitting piece 3 is inserted in the insertion recess 6 of the connector body 5 as the projections 7 are inserted in the cutouts 4 of the connection target 1 as shown in FIG. 30, and thereafter, the shell 8 is pulled down to cover the top of the connector body 5 as shown in FIG. 31 whereby the connection target 1 is pressed onto the connector body 5.

The connection target 1 has a contact point (not shown) on the bottom surface facing the connector body 5, while a contact (not shown) is disposed on the connector body 5. When the connection target 1 is pressed onto the connector body 5 by the shell 8, the contact point of the connection target 1 is brought into contact with the contact of the connector 2, which establishes the connection between the connection target 1 and the connector 2.

When the shell 8 completely lies down, the lateral edges of the shell 8 catch on the metal fixing parts 9 of the connector 2, and as a result, the state where the connection target 1 is pressed onto the connector body 5 so that the connection target 1 is connected to the connector 2 is maintained.

Since the projections 7 of the connector body 5 are inserted in the cutouts 4 of the connection target 1, the connection target 1 is properly positioned with respect to the connector 2, and even if a force acting to pull out the connection target 1 from the connector 2 is exerted, the connection target 1 is prevented from being pulled out from the connector 2.

However, the metal fixing parts 9 for holding the shell 8 in the lying position are located above the projections 7 of the connector body 5 provided to position the connection target 1, that is, overlap the plane of the connection target 1 in the vertical direction, and this results in the increase in the height of the connector 2, disadvantageously.

SUMMARY OF THE INVENTION

The present invention has been made to solve the problem described above and is aimed at providing a connector that can be made thinner, while the connector serves to position a connection target and maintain a connection with the connection target.

A connector according to the present invention comprises:

a ground frame made of metal to be mounted on a mounting surface of a mounting object;

an insulator held by the ground frame and having, formed therein, a connection target housing portion for housing a connection end of a connection target;

a contact having a contact portion and held by the insulator such that the contact portion is exposed at the connection target housing portion; and a cover member made of metal, held by the ground frame to be rotatable between an open position where the connection end of the connection target is allowed to be inserted in the connection target housing portion and a closed position where the connection end of the connection target housed in the connection target housing portion is pressed onto the contact portion of the contact, wherein the cover member has a cover member side locking portion, and the ground frame has a projection that is fitted to a positioning shaped portion of the connection end of the connection target, when the connection end of the connection target is housed in the connection target housing portion, to position the connection target and that catches on the cover member side locking portion, when the cover member is in the closed position, to lock the cover member in the closed position.

BRIEF DESCRIPTION OF THE DRAWINGS

FIG. 24 is a perspective view showing the connector according to Embodiment 2 mounted on the mounting board.

FIG. 25 is a perspective view showing the connection target in a process of being inserted in the connector according to Embodiment 2.

FIG. 26 is a plan view showing the connector of Embodiment 2 in the connected state with the connection target.

DETAILED DESCRIPTION OF THE INVENTION

Embodiments of the present invention are described below based on the appended drawings.

Embodiment 1

Figure 1:
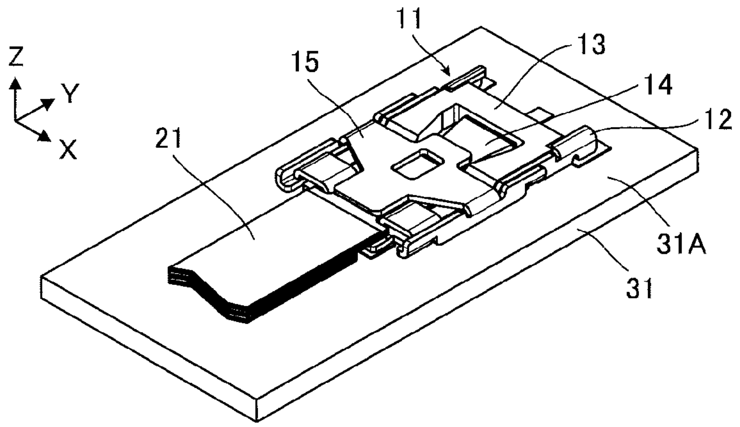
FIG. 1 is a perspective view showing a connector of Embodiment 1 in a connected state with a connection target.

FIG. 1 shows the structure of a connector 11 according to Embodiment 1 in a connected state with a connection target 21. The connector 11 includes a metal ground frame 12 fixed on a mounting surface 31A of a board 31 that is a mounting object, an insulator 13 held by the ground frame 12, a metal contact 14 held by the insulator 13, and a metal cover member 15 rotatably held by the ground frame 12.

The connection target 21 connected to the connector 11 is formed by disposing a conductor pattern on a surface of a plate- or sheet-like base, such as a flexible printed circuit (FPC), a flexible flat cable (FFC) or a rigid circuit board.

For convenience, a plane along the mounting surface 31A of the board 31 is referred to as XY plane, a direction extending perpendicularly to the mounting surface 31A of the board 31 from the mounting surface 31A toward the upper portion where the connector 11 is located as +Z direction, and a direction extending from the connection target 21 toward the connector 11 as +Y direction.

Figure 2:
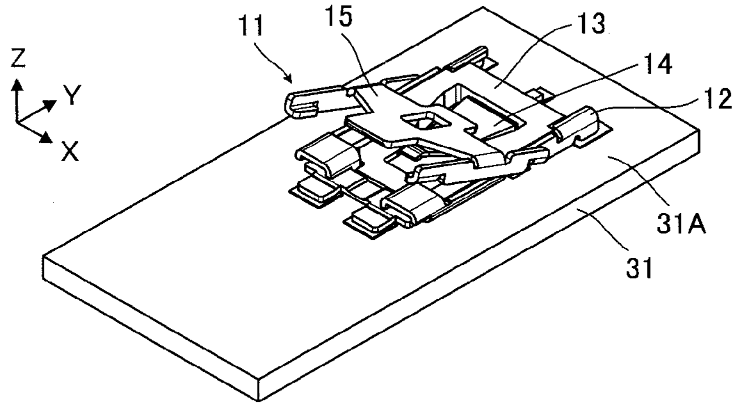
FIG. 2 is a perspective view showing the connector of Embodiment 1 with a cover member in an open position.
Figure 3:
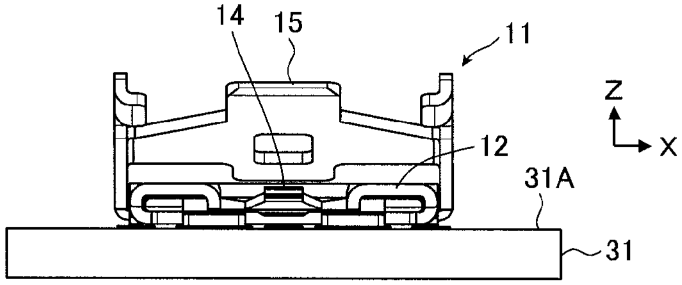
FIG. 3 is a front view showing the connector of Embodiment 1 with the cover member in the open position.
Figure 4:
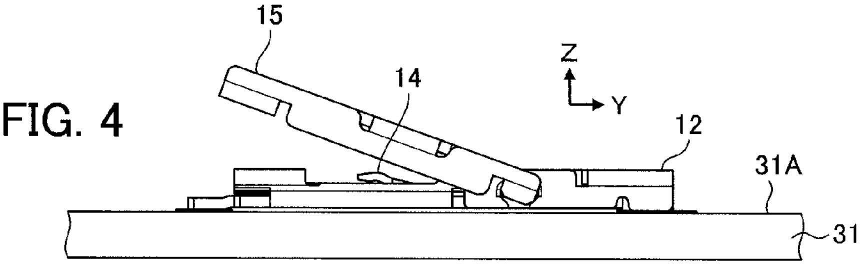
FIG. 4 is a side view showing the connector of Embodiment 1 with the cover member in the open position.

The cover member 15 can be rotated with respect to the ground frame 12 to establish an open position where the cover member 15 inclines and opens in the −Y direction as shown in FIGS. 2 to 4. In this state, a connection end of the connection target 21 can be inserted into the connector 11 by moving the connection target 21 from the −Y direction side to the +Y direction side.

Figure 5:
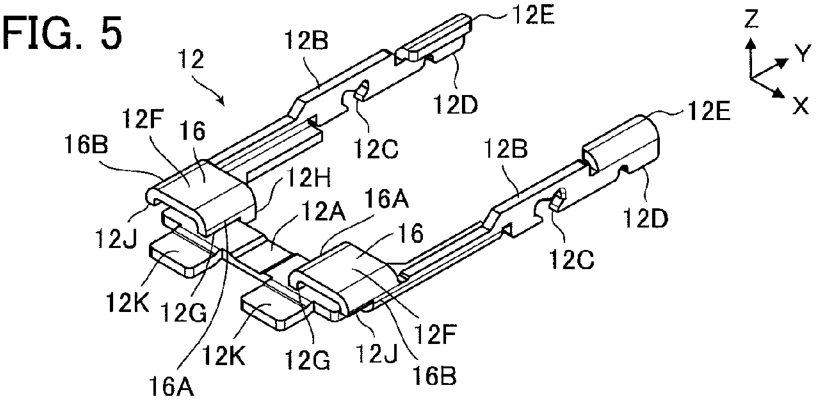
FIG. 5 is a perspective view showing a ground frame of the connector according to Embodiment 1.

The structure of the ground frame 12 is shown in FIG. 5. The ground frame 12 is composed of a bent metal sheet and includes a band portion 12A extending in the X direction. A pair of arm portions 12B separately extend in parallel to each other from the opposite ends, in the X direction, of the band portion 12A toward the +Y direction. At each of the arm portions 12B, an axial tab receiving portion 12C for rotatably supporting the cover member 15 is formed. The axial tab receiving portion 12C has a cutout shape that opens in the −Z direction.

Each of the arm portions 12B further has, formed at its +Y direction side end, a ground frame side soldered portion 12D that slightly projects in the −Z direction and an insulator holding portion 12E that projects from the +Z direction side edge toward the other arm portion 12B in the X direction.

The ground frame 12 further includes a pair of bent-back portions 12F that bend to separately extend over the band portion 12A from the opposite ends, in the X direction, of the band portion 12A. Each of the bent-back portions 12F extends to overlap the +Z direction side surface of the band portion 12A with a gap between the bent-back portion 12F and the +Z direction side surface of the band portion 12A.

These bent-back portions 12F constitute a pair of projections 16 that project in the +Z direction to position the connection target 21 being in the connected state with the connector 11 and to lock the position of the cover member 15.

The projections 16 have first lateral portions 16A that face inwardly in the X direction to face each other and second lateral portions 16B that face outwardly in the X direction. The first lateral portions 16A are provided to position the connection target 21 with respect to the connector 11. At the first lateral portions 16A, the bent-back portions 12F each have, at its end, an abutment portion 12G that abuts on the +Z direction side surface of the band portion 12A and a lateral surface contacting portion 12H that extends in the −Z direction beyond the +Z direction side surface of the band portion 12A to be in contact with the +Y direction side lateral surface of the band portion 12A.

At each of the second lateral portions 16B of the pair of projections 16, a ground frame side locking portion 12J that is a cutout facing in the −Z direction is formed.

A pair of ground frame fixing portions 12K projecting in the −Y direction are joined to the −Y direction side lateral surface of the band portion 12A.

The ground frame 12 as above can be produced by cutting and bending a single metal sheet.

Figure 6:
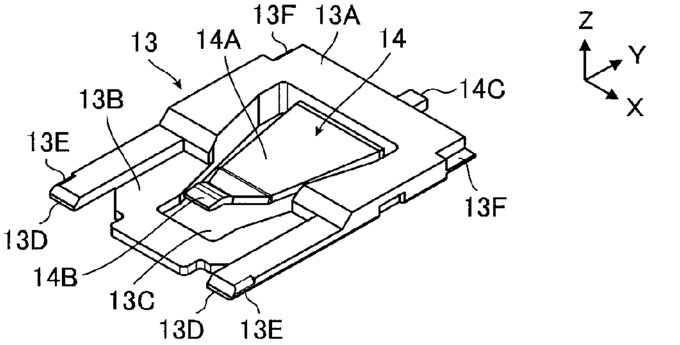
FIG. 6 is a perspective view showing an insulator and a contact of the connector according to Embodiment 1.

The structures of the insulator 13 and the contact 14 are shown in FIG. 6. The insulator 13 has an insulator body 13A formed integrally with a part of the contact 14. The insulator body 13A has a flat, substantially rectangular shape to be fitted between the pair of arm portions 12B of the ground frame 12. The insulator body 13A has, formed at its −Y direction side, a connection target housing portion 13B that is a recess for housing the connection end of the connection target 21 and an opening 13C that allows the contact 14 to be exposed in the central region of the insulator body 13A.

A pair of extending portions 13D separately extend in parallel to each other from the +X direction side and −X direction side ends of the insulator body 13A toward the −Y direction. The extending portions 13D are each inserted in the gap between the corresponding bent-back portion 12F and the band portion 12A. Chamfers 13E corresponding to bends of the bent-back portions 12F of the ground frame 12 are respectively formed at edges, facing outwardly in the X direction, of the pair of extending portions 13D.

In addition, step portions 13F to be brought into contact with the insulator holding portions 12E of the ground frame 12 are formed at the +Y direction side end of the insulator body 13A at the opposite ends thereof in the X direction.

The contact 14 is formed integrally with the insulator body 13A to be thereby held by the insulator 13. The contact 14 includes a contact side spring portion 14A of flat spring type that is elastically deformable and is exposed at the opening 13C of the insulator body 13A. The contact side spring portion 14A has, formed at its −Y direction side end, a contact portion 14B facing in the +Z direction.

The contact 14 further includes a contact side soldered portion 14C that projects in the +Y direction from the +Y direction side end of the insulator body 13A.

The insulator 13 formed integrally with the contact 14 can be produced by, for instance, insert molding.

Figure 7:
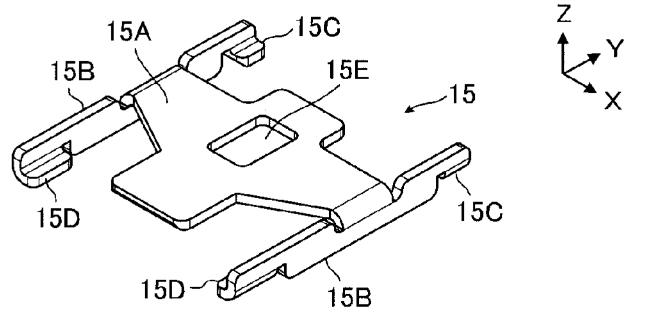
FIG. 7 is a perspective view showing the cover member of the connector according to Embodiment 1.

The structure of the cover member 15 is shown in FIG. 7. The cover member 15 includes a cover body 15A that presses, in the −Z direction, the connection end of the connection target 21 housed in the connection target housing portion 13B of the insulator 13 and a pair of arm portions 15B that separately extend in parallel to each other in both +Y and −Y directions from the opposite ends, in the X direction, of the cover body 15A.

Each of the arm portions 15B has, formed at its +Y direction side end, a rotating axial tab 15C that projects toward the other arm portion 15B in the X direction. The rotating axial tabs 15C are inserted in the axial tab receiving portions 12C of the ground frame 12 whereby the cover member 15 is held to be rotatable with respect to the ground frame 12.

Each of the arm portions 15B further has, formed at its −Y direction side end, a cover member side locking portion 15D that projects from the −Z direction side edge toward the other arm portion 15B in the X direction. In the connected state between the connector 11 and the connection target 21, the cover member side locking portions 15D catch on the ground frame side locking portions 12J of the ground frame 12 to lock the cover member 15.

An opening 15E is formed in the central region of the cover body 15A at the position corresponding to the contact portion 14B of the contact 14.

The cover member 15 as above can be produced by cutting and bending a single metal sheet, similarly to the ground frame 12.

Figure 8:
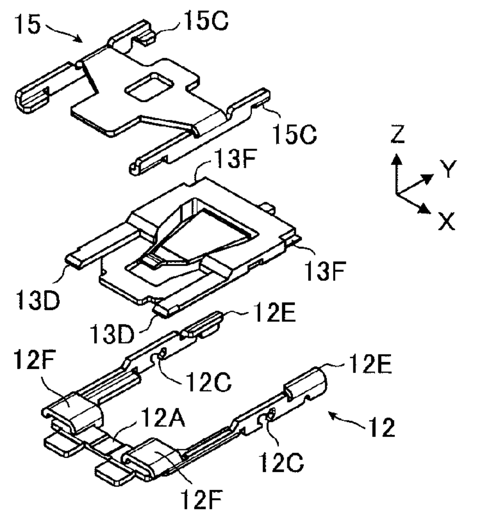
FIG. 8 is an exploded view of the connector according to Embodiment 1.

As shown in FIG. 8, the pair of extending portions 13D of the insulator 13 formed integrally with the contact 14 are inserted in the gaps between the bent-back portions 12F and the band portion 12A of the ground frame 12, and the step portions 13F of the insulator 13 are held by the corresponding insulator holding portions 12E of the ground frame 12, so that the insulator 13 is retained on the ground frame 12, and the pair of rotating axial tabs 15C of the cover member 15 are inserted in the corresponding axial tab receiving portions 12C of the ground frame 12 so that the cover member 15 is rotatably retained on the ground frame 12. The connector 11 according to Embodiment 1 is thus manufactured.

Figure 9:
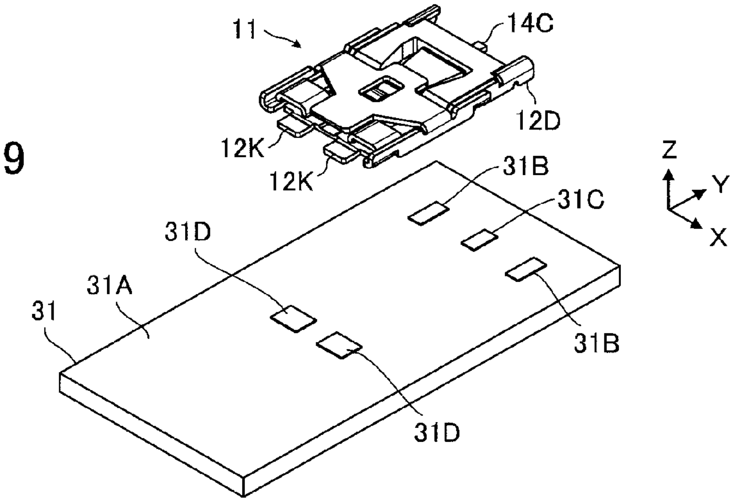
FIG. 9 is a perspective view showing the connector according to Embodiment 1 in a process of being mounted on a mounting board.
Figure 10:
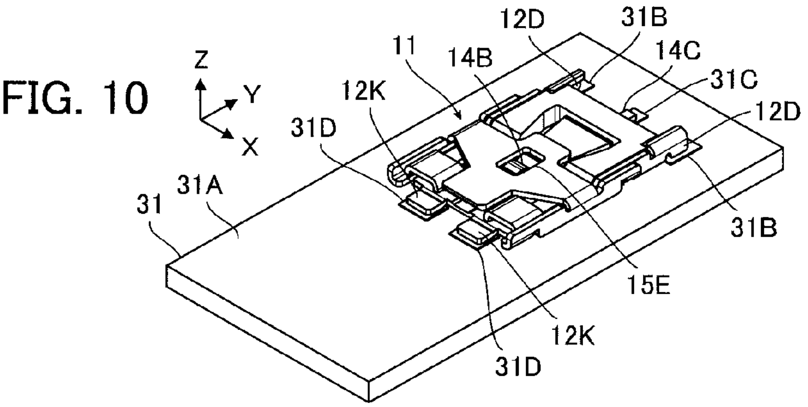
FIG. 10 is a perspective view showing the connector according to Embodiment 1 mounted on the mounting board.

Thereafter, as shown in FIG. 9, the pair of ground frame side soldered portions 12D of the ground frame 12 and the contact side soldered portion 14C of the contact 14 are bonded by soldering to a pair of connection pads 31B for a ground frame and a connection pad 31C for a contact as formed on the mounting surface 31A of the board 31, and the pair of ground frame fixing portions 12K of the ground frame 12 are bonded by soldering to a pair of fixing pads 31D formed on the mounting surface 31A of the board 31, whereby the connector 11 can be mounted on the mounting surface 31A of the board 31 as shown in FIG. 10.

Figure 11:
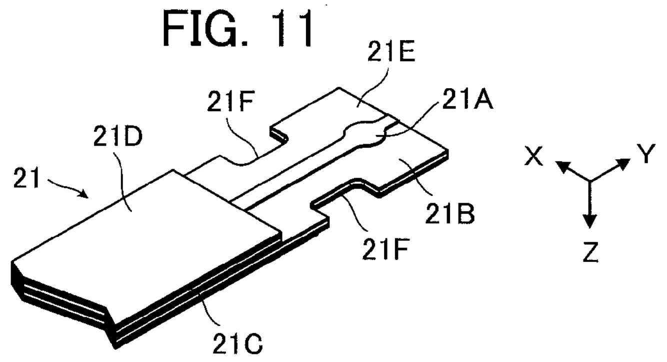
FIG. 11 is a perspective view showing the connection target.

The structure of the connection target 21 is shown in FIG. 11. The connection target 21 is an FPC of band shape in which a sheet type ground lead 21C is stacked on each side of a sheet type signal line 21A via an insulating layer 21B, and an insulating layer 21D is further stacked on the outer surface of the ground lead 21C as the outermost layer. At a connection end 21E to be connected to the connector 11, however, the insulating layers 21D being the outermost layers on both sides are removed, and one insulating layer 21B and one ground lead 21C stacked on one side of the signal line 21A are removed, so that the signal line 21A is exposed. In other words, the connection end 21E is made up of, in addition to the signal line 21A, only the other insulating layer 21B and the other ground lead 21C that are stacked on the other side of the signal line 21A.

The connection end 21E has, formed at its opposite edges, positioning shaped portions 21F constituted of cutouts.

Figure 12:
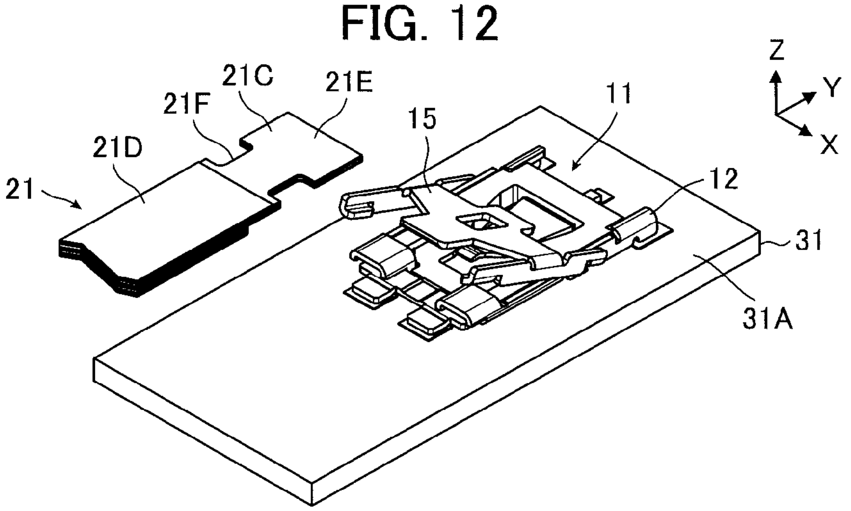
FIG. 12 is a perspective view showing the connection target in a process of being inserted in the connector according to Embodiment 1.

To connect the connection target 21 to the connector 11, as shown in FIG. 12, the cover member 15 of the connector 11 is rotated with respect to the ground frame 12 to establish an opening position where the cover member 15 opens in the −Y direction, and the connection end 21E of the connection target 21 is inserted into the connector 11 with the surface, on which the signal line 21A is exposed, facing in the −Z direction.

Figure 13:
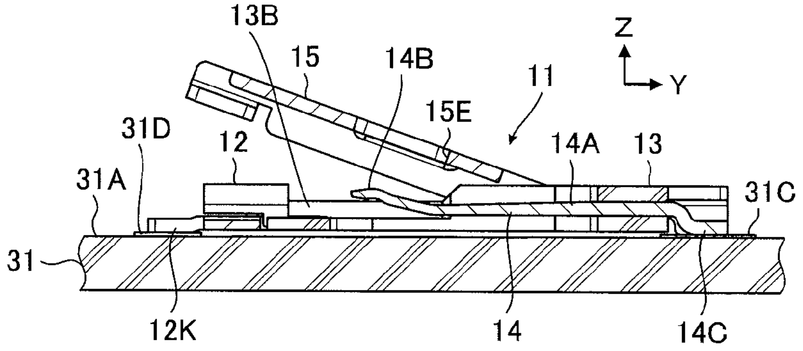
FIG. 13 is a cross-sectional view showing the connector of Embodiment 1 with the cover member in the open position.

At this time, in the connector 11, the contact portion 14B of the contact 14 held by the insulator body 13A of the insulator 13 projects at the +Z direction side of the connection target housing portion 13B, which is a recess, by the action of the contact side spring portion 14A, as shown in FIG. 13.

Figure 14:
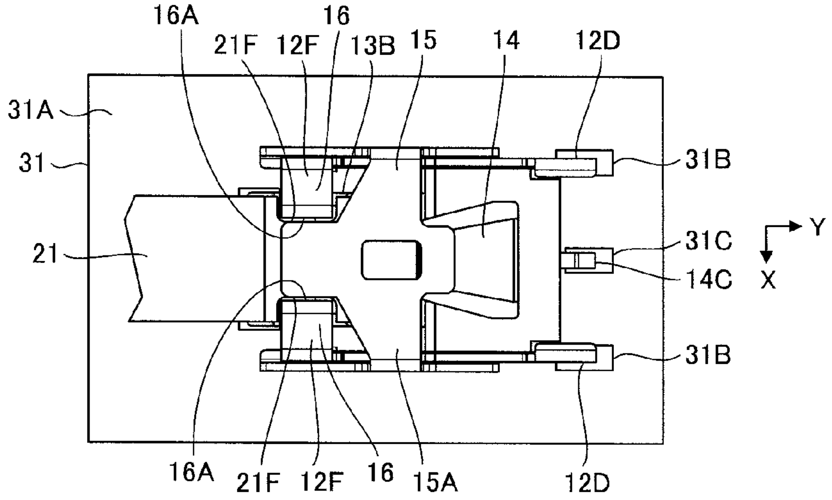
FIG. 14 is a plan view showing the connector of Embodiment 1 in the connected state with the connection target.
Figure 15:
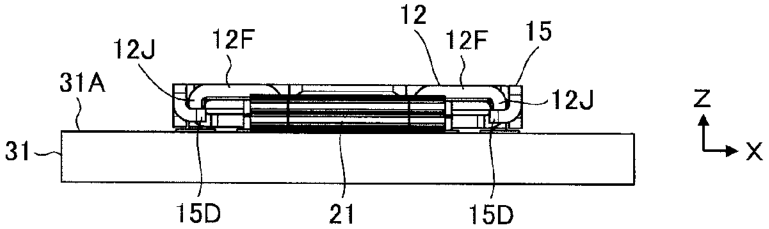
FIG. 15 is a front view showing the connector of Embodiment 1 in the connected state with the connection target.
Figure 16:
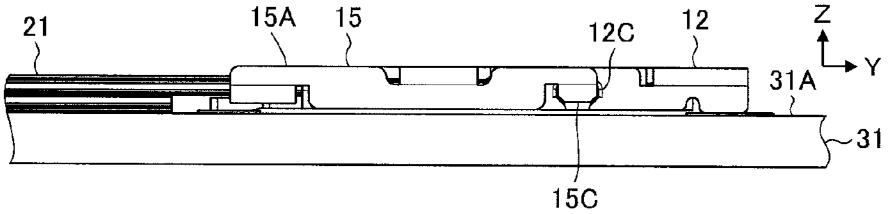
FIG. 16 is a side view showing the connector of Embodiment 1 in the connected state with the connection target.

The connection end 21E of the connection target 21 is housed in the connection target housing portion 13B of the insulator 13 of the connector 11, and the cover member 15 is rotated to a closed position where the cover body 15A of the cover member 15 lies in the XY plane parallel to the mounting surface 31A of the board 31, as shown in FIGS. 14 to 16. Thus the connected state is established between the connector 11 and the connection target 21.

When the connection end 21E of the connection target 21 is housed in the connection target housing portion 13B of the insulator 13 of the connector 11, as shown in FIG. 14, the first lateral portions 16A of the projections 16 constituted of the pair of bent-back portions 12F of the ground frame 12 are fitted to the positioning shaped portions 21F of the connection end 21E of the connection target 21 to thereby position the connection target 21 with respect to the connector 11.

Besides, as shown in FIG. 5, the end of each bent-back portion 12F of the ground frame 12 is bent to extend in the −Z direction, and has the abutment portion 12G that abuts on the +Z direction side surface of the band portion 12A and the lateral surface contacting portion 12H that extends in the −Z direction beyond the +Z direction side surface of the band portion 12A to be in contact with the +Y direction side lateral surface of the band portion 12A. Owing to this configuration, even if a force acting to pull out the connection target 21 in the connected state with the connector 11 is exerted, the lateral surface contacting portions 12H catch on the +7 direction side lateral surface of the band portion 12A, which can reduce the risk of deformation or breakage of the bent-back portions 12F along the XY plane, and the abutment portions 12G abut on the +Z direction side surface of the band portion 12A, which can reduce the risk of deformation or breakage of the bent-back portions 12F in the −Z direction. Thus the connected state is maintained between the connector 11 and the connection target 21.

When the cover member 15 is rotated to the closed position, as shown in FIG. 15, the cover member side locking portions 15D of the cover member 15 catch on the ground frame side locking portions 12J of the ground frame 12, whereby the cover member 15 is locked in the closed position.

Figure 17:
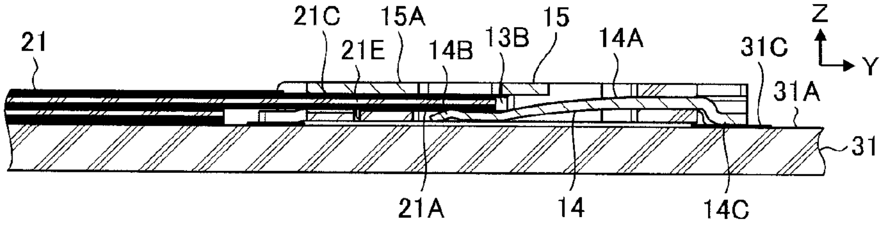
FIG. 17 is a cross-sectional view showing the connector of Embodiment 1 in the connected state with the connection target.

As a result, as shown in FIG. 17, the connection end 21E of the connection target 21 housed in the connection target housing portion 13B of the insulator 13 is pressed in the −Z direction by the cover body 15A of the cover member 15, 80 that the signal line 21A of the connection end 21E facing in the −Z direction is brought into contact with the contact portion 14B of the contact 14. At this time, a spring force directed in the +Z direction acts on the contact portion 14B of the contact 14 by the contact side spring portion 14A, and therefore the signal line 21A of the contact target 21 and the contact portion 14B of the contact 14 can be electrically connected to each other in a reliable manner. As a consequence, the signal line 21A of the connection target 21 is connected to the connection pad 31C for a contact on the board 31 via the contact side spring portion 14A and the contact side soldered portion 14C of the contact 14.

In addition, the ground lead 21C of the connection target 21 facing in the +Z direction is brought into contact with the cover body 15A of the cover member 15 and thereby connected to the connection pads 31B for a ground frame on the board 31 via, sequentially, the cover body 15A, arm portions 15B and rotating axial tabs 15C of the cover member 15 and the axial tab receiving portions 12C, arm portions 12B and ground frame side soldered portions 12D of the ground frame 12.

The connection target 21 can be detached from the connector 11 by releasing the cover member side locking portions 15D of the cover member 15 from the ground frame side locking portions 12J of the ground frame 12 to unlock the cover member 15 and then rotating the cover member 15 to the open position.

When the connection end 21E of the connection target 21 is not housed in the connection target housing portion 13B of the insulator 13, the contact portion 14B of the contact 14 projects above the connection target housing portion 13B of the insulator 13 by the action of the contact side spring portion 14A as shown in FIG. 13; however, owing to the opening 15E formed in the cover body 15A of the cover member 15, when the cover member 15 is rotated to the closed position, the contact portion 14B of the contact 14 is caused to lie within the opening 15E of the cover body 15A as shown in FIG. 10. Therefore, even when the cover member 15 is in the closed position, the contact portion 14B of the contact 14 is not pressed in the −Z direction by the cover body 15A, that is, not elastically deformed; and even when the state where the connection target 21 is not connected lasts for a long time, the spring properties of the contact side spring portion 14A of the contact 14 do not deteriorate, and the contact portion 14B of the contact 14 is not damaged.

In the connector 11, the first lateral portions 16A, facing inwardly in the X direction, of the pair of projections 16 of the ground frame 12 function to position the connection target 21 with respect to the connector 11, and the second lateral portions 16B facing outwardly in the X direction constitute the ground frame side locking portions 12J that function to lock the cover member 15 in the closed position. Owing to this configuration, the connector 11 can be made thinner, while the connector 11 serves to position the connection target 21 and maintain the connection with the connection target 21.

According to Embodiment 1 described above, with the cover member 15 being locked in the closed position, the connector 11 can take on a thin and compact shape with a size of, approximately, 2.7 mm wide (X direction)×4.2 mm long (Y direction)×0.4 mm high (Z direction).

Since the ground frame 12 and the cover member 15 are both made of metal, and the cover member 15 is locked in the closed position by the interlock between the ground frame side locking portions 12J of the ground frame 12 and the cover member side locking portions 15D of the cover member 15, namely, between metal members, a firmly locked state can be ensured.

Embodiment 2

Figure 18:
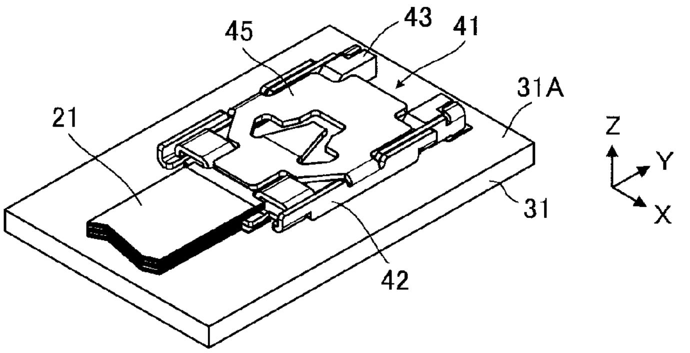
FIG. 18 is a perspective view showing a connector of Embodiment 2 in a connected state with a connection target.

FIG. 18 shows the structure of a connector 41 according to Embodiment 2 in a connected state with a connection target 21. The connector 41 includes a metal ground frame 42 fixed on the mounting surface 31A of the board 31, an insulator 43 held by the ground frame 42, a metal contact held by the insulator 43, which will be described later, and a metal cover member 45 rotatably held by the ground frame 42.

While the connector 11 of Embodiment 1 described above is configured so that the contact 14 has the contact side spring portion 14A provided to press the contact portion 14B onto the signal line 21A of the connection target 21, the connector 41 of Embodiment 2 is configured so that the cover member 45 presses the signal line 21A of the connection target 21 onto the contact.

Figure 19:
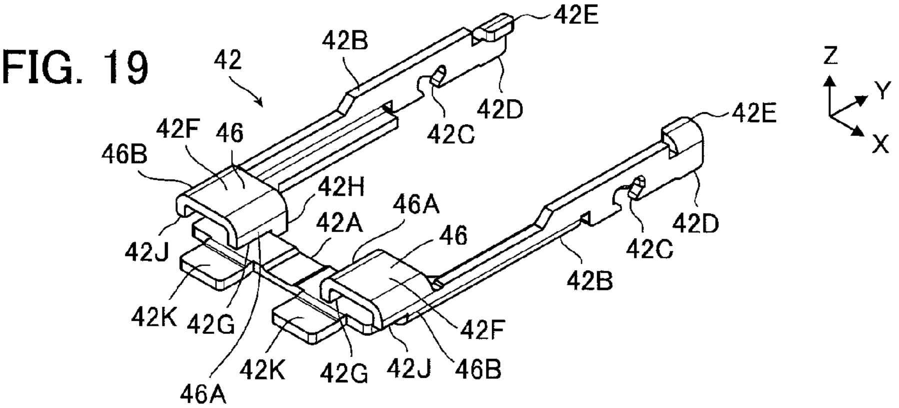
FIG. 19 is a perspective view showing a ground frame of the connector according to Embodiment 2.

The ground frame 42 has the same structure as the ground frame 12 of Embodiment 1, as shown in FIG. 19. More specifically, the ground frame 42 is composed of a bent metal sheet and includes a band portion 42A extending in the X direction and a pair of arm portions 42B separately extending in parallel to each other from the opposite ends, in the X direction, of the band portion 42A toward the +Y direction. At each of the arm portions 42B, an axial tab receiving portion 42C of cutout shape that opens in the −Z direction is formed.

Each of the arm portions 42B further has, formed at its +Y direction side end, a ground frame side soldered portion 42D that slightly projects in the −Z direction and an insulator holding portion 42E that projects from the +Z direction side edge toward the other arm portion 42B in the X direction.

The ground frame 42 further includes a pair of bent-back portions 42F that bend to separately extend over the band portion 42A from the opposite ends, in the X direction, of the band portion 42A. Each of the bent-back portions 42F extends to overlap the +Z direction side surface of the band portion 42A with a gap between the bent-back portion 42F and the +Z direction side surface of the band portion 42A.

These bent-back portions 42F constitute a pair of projections 46 that project in the +Z direction to position the connection target 21 being in the connected state with the connector 41 and to lock the position of the cover member 45.

The projections 46 have first lateral portions 46A that face inwardly in the X direction to face each other and second lateral portions 46B that face outwardly in the X direction. The first lateral portions 46A are provided to position the connection target 21 with respect to the connector 41. At the first lateral portions 46A, the bent-back portions 42F each have, at its end, an abutment portion 42G that abuts on the +Z direction side surface of the band portion 42A and a lateral surface contacting portion 42H that extends in the −Z direction beyond the +Z direction side surface of the band portion 42A to be in contact with the +Y direction side lateral surface of the band portion 42A.

At each of the second lateral portions 46B of the pair of projections 46, a ground frame side locking portion 42J that is a cutout facing in the −Z direction is formed.

A pair of ground frame fixing portions 42K projecting in the −Y direction are joined to the −Y direction side lateral surface of the band portion 42A.

The ground frame 42 as above can be produced by cutting and bending a single metal sheet.

Figure 20:
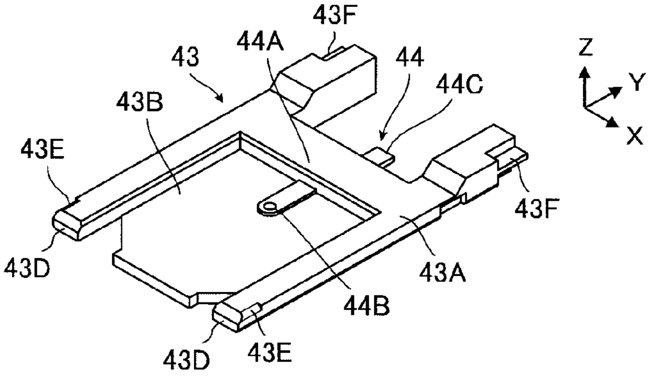
FIG. 20 is a perspective view showing an insulator and a contact of the connector according to Embodiment 2.

As shown in FIG. 20, the insulator 43 has an insulator body 43A formed integrally with a part of a contact 44. The insulator body 43A has, formed at its −Y direction side, a connection target housing portion 43B that is a recess for housing the connection end of the connection target 21.

A pair of extending portions 43D separately extend in parallel to each other from the +X direction side and −X direction side ends of the insulator body 43A toward the −Y direction. Chamfers 43E corresponding to bends of the bent-back portions 42F of the ground frame 42 are respectively formed at edges, facing outwardly in the X direction, of the extending portions 43D.

In addition, step portions 43F to be brought into contact with the insulator holding portions 42E of the ground frame 42 are formed at the +Y direction side end of the insulator body 43A at the opposite ends thereof in the X direction.

The contact 44, which is a member of band shape extending in the Y direction, is formed integrally with the insulator body 43A to be thereby held by the insulator 43. The contact 44 includes a contact portion 44B that is exposed at the connection target housing portion 43B of the insulator body 43A and faces in the +Z direction.

The contact 44 further includes a contact side soldered portion 44C that projects in the +Y direction from the +Y direction side end of the insulator body 43A.

The insulator 43 formed integrally with the contact 44 can be produced by, for instance, insert molding.

Figure 21:
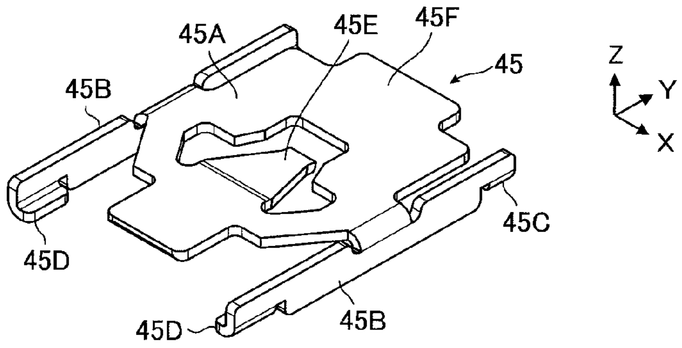
FIG. 21 is a perspective view showing a cover member of the connector according to Embodiment 2.

As shown in FIG. 21, the cover member 45 includes a cover body 45A and a pair or arm portions 45B extending in parallel to each other in both +Y and −Y directions from the opposite ends, in the X direction, of the cover body 45A. Each of the arm portions 45B has, formed at its +Y direction side end, a rotating axial tab 45C that projects toward the other arm portion 45B in the X direction.

Each of the arm portions 45B further has, formed at its −Y direction side end, a cover member side locking portion 45D that projects from the −Z direction side edge toward the other arm portion 45B in the X direction.

In addition, a cover member side spring portion 45E that is elastically deformable is formed in the central region of the cover body 45A to press, in the −Z direction, the connection end of the connection target 21 housed in the connection target housing portion 43B of the insulator 43, and a ceiling portion 45F is formed at a +Y direction side region of the cover body 45A to cover a +Y direction side region of the contact 44 when the cover member 45 is in the closed position.

The cover member 45 as above can be produced by cutting and bending a single metal sheet, similarly to the ground frame 42.

Figure 22:
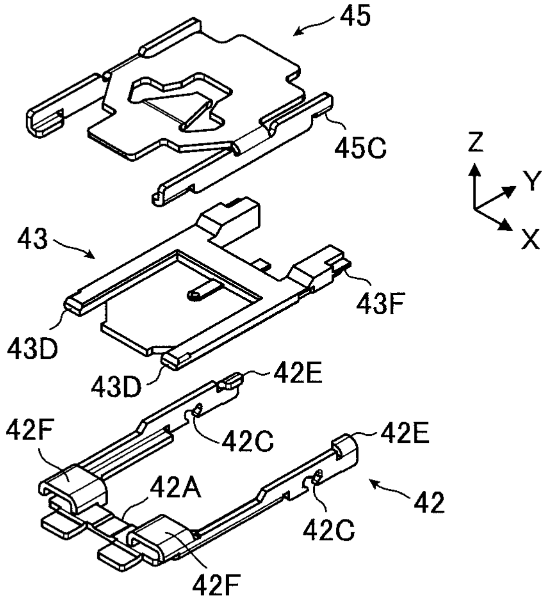
FIG. 22 is an exploded view of the connector according to Embodiment 2.

As shown in FIG. 22, the pair of extending portions 43D of the insulator 43 formed integrally with the contact 44 are inserted in the gaps between the bent-back portions 42F and the band portion 42A of the ground frame 42, and the step portions 43F of the insulator 43 are held by the corresponding insulator holding portions 42E of the ground frame 42, so that the insulator 43 is retained on the ground frame 42, and the pair of rotating axial tabs 45C of the cover member 45 are inserted in the corresponding axial tab receiving portions 42C of the ground frame 42 so that the cover member 45 is rotatably retained on the ground frame 42. The connector 41 according to Embodiment 2 is thus manufactured.

Figure 23:
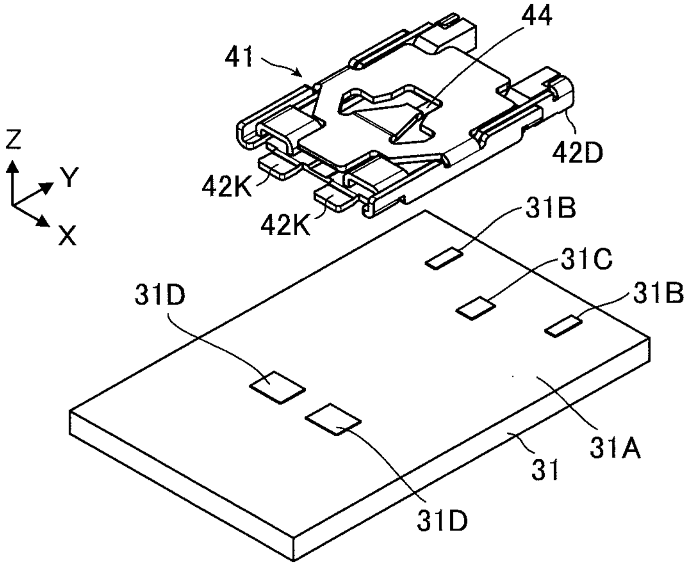
FIG. 23 is a perspective view showing the connector according to Embodiment 2 in a process of being mounted on the mounting board.

Thereafter, as shown in FIG. 23, the pair of ground frame side soldered portions 42D of the ground frame 42 and the contact side soldered portion 44C (not shown) of the contact 44 are bonded by soldering to the pair of connection pads 31B for a ground frame and the connection pad 31C for a contact as formed on the mounting surface 31A of the board 31, and the pair of ground frame fixing portions 42K of the ground frame 42 are bonded by soldering to the pair of fixing pads 31D formed on the mounting surface 31A of the board 31, whereby the connector 41 can be mounted on the mounting surface 31A of the board 31 as shown in FIG. 24.

To connect the connection target 21 to the connector 41, as shown in FIG. 25, the cover member 45 of the connector 41 is rotated with respect to the ground frame 42 to establish an opening position where the cover member 45 opens in the −Y direction, and the connection end 21E of the connection target 21 is inserted into the connector 41 with the surface, on which the signal line 21A is exposed, facing in the −Z direction.

Figure 27:
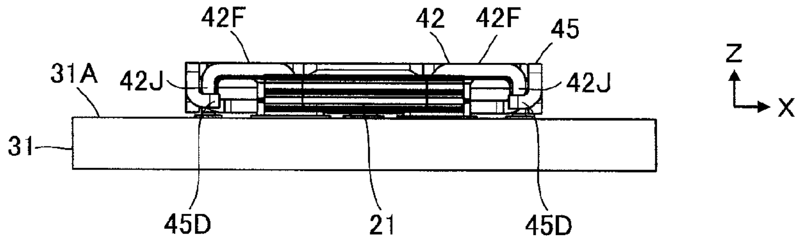
FIG. 27 is a front view showing the connector of Embodiment 2 in the connected state with the connection target.
Figure 28:
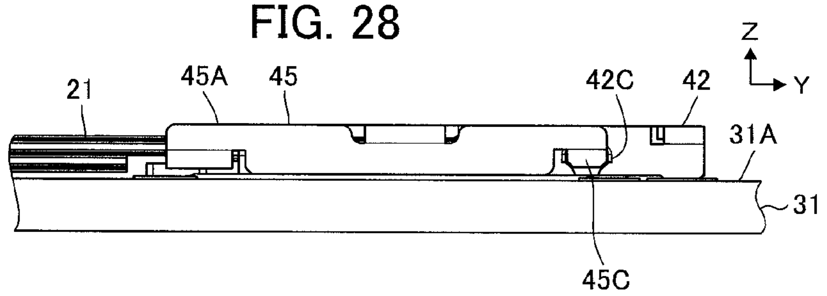
FIG. 28 is a side view showing the connector of Embodiment 2 in the connected state with the connection target.

The connection end 21E of the connection target 21 is housed in the connection target housing portion 43B of the insulator 43 of the connector 41, and the cover member 45 is rotated to a closed position where the cover body 45A of the cover member 45 lies in the XY plane parallel to the mounting surface 31A of the board 31, as shown in FIGS. 26 to 28. Thus the connected state is established between the connector 41 and the connection target 21.

When the connection end 21E of the connection target 21 is housed in the connection target housing portion 43B of the insulator 43 of the connector 41, as shown in FIG. 26, the first lateral portions 46A of the projections 46 constituted of the pair of bent-back portions 42F of the ground frame 42 are fitted to the positioning shaped portions 21F of the connection end 21E of the connection target 21 to thereby position the connection target 21 with respect to the connector 41.

Besides, as with the connector 11 of Embodiment 1, the end of each bent-back portion 42F of the ground frame 42 is bent to extend in the −Z direction, and has the abutment portion 42G that abuts on the +Z direction side surface of the band portion 42A and the lateral surface contacting portion 42H that extends in the −Z direction beyond the +Z direction side surface of the band portion 42A to be in contact with the +Y direction side lateral surface of the band portion 42A. Owing to this configuration, even if a force acting to pull out the connection target 21 in the connected state with the connector 41 is exerted, the lateral surface contacting portions 42H catch on the +Y direction side lateral surface of the band portion 42A, which can reduce the risk of deformation or breakage of the bent-back portions 42F along the XY plane, and the abutment portions 42G abut on the +Z direction side surface of the band portion 42A, which can reduce the risk of deformation or breakage of the bent-back portions 42F in the −Z direction. Thus the connected state is maintained between the connector 41 and the connection target 21.

When the cover member 45 is rotated to the closed position, as shown in FIG. 27, the cover member side locking portions 45D of the cover member 45 catch on the ground frame side locking portions 42J of the ground frame 42, whereby the cover member 45 is locked in the closed position.

Figure 29:
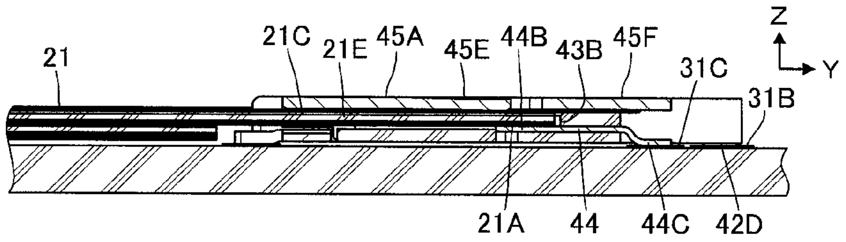
FIG. 29 is a cross-sectional view showing the connector of Embodiment 2 in the connected state with the connection target.
Figure 30:
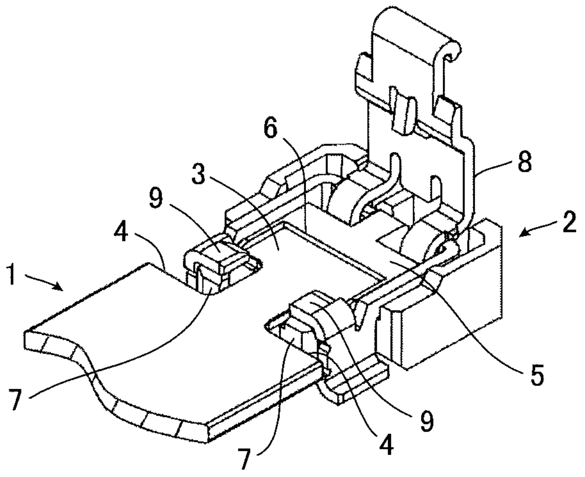
FIG. 30 PRIOR ART
FIG. 30 is a perspective view showing a conventional connector with a connection target being inserted and a shell being in an open position.
Figure 31:
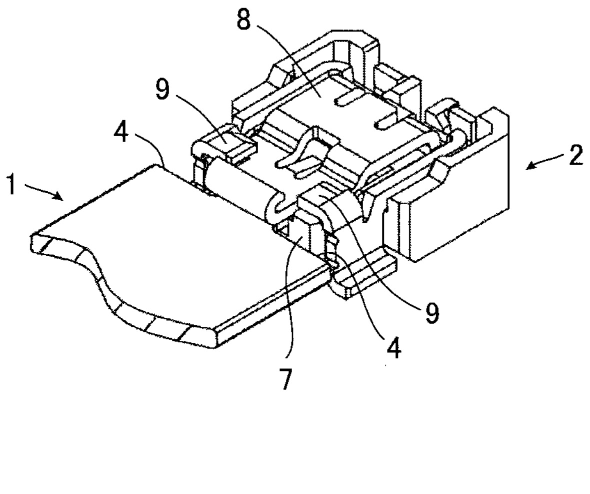
FIG. 31 PRIOR ART
FIG. 31 is a perspective view showing the conventional connector with the connection target being inserted and the shell being in a closed position.

As a consequence, the connection end 21E of the connection target 21 housed in the connection target housing portion 43B of the insulator 43 is covered by the cover member 45 as shown in FIG. 29. At this time, since the cover member side spring portion 45E is formed at the cover member 45, the connection end 21E of the connection target 21 is pressed in the −Z direction by the cover member side spring portion 45E of the cover member 45, so that the signal line 21A facing in the −Z direction at the connection end 21E is brought into contact with the contact portion 44B of the contact 44 to thereby establish the electrical connection. Thus the signal line 21A of the connection target 21 is connected to the connection pad 31C for a contact on the board 31 via the contact side soldered portion 44C of the contact 44.

In addition, the ground lead 21C of the connection target 21 facing in the +Z direction is brought into contact with the cover body 45A of the cover member 45 and thereby connected to the connection pads 31B for a ground frame on the board 31 via, sequentially, the cover body 45A, arm portions 45B and rotating axial tabs 45C of the cover member 45 and the axial tab receiving portions 42C, arm portions 42B and ground frame side soldered portions 42D of the ground frame 42.

The connection target 21 can be detached from the connector 41 by releasing the cover member side locking portions 45D of the cover member 45 from the ground frame side locking portions 42J of the ground frame 42 to unlock the cover member 45 and then rotating the cover member 45 to the open position.

Also in the connector 41 according to Embodiment 2, the first lateral portions 46A, facing inwardly in the X direction, of the pair of projections 46 of the ground frame 42 function to position the connection target 21 with respect to the connector 41, and the second lateral portions 46B facing outwardly in the X direction constitute the ground frame side locking portions 42J that function to lock the cover member 45 in the closed position. Owing to this configuration, the connector 41 can be made thinner, while the connector 41 serves to position the connection target 21 and maintain the connection with the connection target 21.

Since the ground frame 42 and the cover member 45 are both made of metal, and the cover member 45 is locked in the closed position by the interlock between the ground frame side locking portions 42J of the ground frame 42 and the cover member side locking portions 45D of the cover member 45, namely, between metal members, a firmly locked state can be ensured.

Furthermore, in the connector 41 of Embodiment 2, the cover body 45A of the cover member 45 has the ceiling portion 45F, and the +Y direction side region of the contact 44 connected to the signal line 21A of the connection target 21 is covered by the ceiling portion 45F as shown in FIG. 29, so that electromagnetic wave shielding properties are improved.

In the connector 11 of Embodiment 1, a ceiling portion may also be formed at the cover body 15A of the cover member 15 to cover at least a part of the contact 14, thereby improving electromagnetic wave shielding properties.

While the connector 11 according to Embodiment 1 or the connector 41 according to Embodiment 2 includes the single contact 14 or 44, and the connection target 21 includes the single signal line 21A, the invention is not limited thereto, and a connector may have a multi-contact structure with plural contacts to be connected to plural signal lines of a connection target.

What is claimed is:

1. A connector in which a connection end of a connection target of plate- or sheet-type is inserted, the connection target having a positioning shaped portion formed therein, the connector comprising:

a ground frame made of metal to be mounted on a mounting surface of a mounting object;

an insulator held by the ground frame and having, formed therein, a connection target housing portion for housing the connection end of the connection target;

a contact having a contact portion and held by the insulator such that the contact portion is exposed at the connection target housing portion; and a cover member made of metal, held by the ground frame to be rotatable between an open position where the connection end of the connection target is allowed to be inserted in the connection target housing portion and a closed position where the connection end of the connection target housed in the connection target housing portion is pressed onto the contact portion of the contact, wherein the cover member has a cover member side locking portion, and the ground frame has a projection that is fitted to the positioning shaped portion, when the connection end of the connection target is housed in the connection target housing portion, to position the connection target and that catches on the cover member side locking portion, when the cover member is in the closed position, to lock the cover member in the closed position.

2. The connector according to claim 1, wherein the projection has a first lateral portion and a second lateral portion that face in directions perpendicular to a direction in which the connection end of the connection target is inserted and in opposite directions to each other along the mounting surface, the first lateral portion is fitted to the positioning shaped portion of the connection target housed in the connection target housing portion, and the second lateral portion has, formed therein, a ground frame side locking portion that catches on the cover member side locking portion of the cover member in the closed position.

3. The connector according to claim 1, wherein the ground frame is composed of a bent metal sheet.

4. The connector according to claim 3, wherein the ground frame includes:

a band portion disposed on the mounting surface of the mounting object and extending in a direction perpendicular to the direction in which the connection end of the connection target is inserted;

a pair of arm portions separately extending from opposite ends of the band portion toward the direction in which the connection end of the connection target is inserted; and a pair of bent-back portions bent to separately extend over the band portion from the opposite ends of the band portion, and wherein each of the pair of bent-back portions constitutes the projection.

5. The connector according to claim 4, wherein the cover member has a rotating axial tab, and the ground frame has an axial tab receiving portion that is formed in each of the pair of arm portions and rotatably supports the rotating axial tab of the cover member.

6. The connector according to claim 5, wherein the cover member is electrically connected to the ground frame via the rotating axial tab and the axial tab receiving portion.

7. The connector according to claim 4, wherein the bent-back portion has, at its end, an abutment portion that is bent to extend toward the mounting surface of the mounting object and abuts on a surface of the band portion, and a lateral surface contacting portion that extends beyond the surface of the band portion toward the mounting surface to be in contact with a lateral surface of the band portion, which lateral surface faces the pair of arm portions.

8. The connector according to claim 4, wherein each of the pair of arm portions has, formed at its end, a ground frame side soldered portion to be bonded by soldering to the mounting surface of the mounting object.

9. The connector according to claim 4, wherein the ground frame has a ground frame fixing portion joined to the band portion, the ground frame fixing portion being to be bonded by soldering to the mounting surface of the mounting object to fix the ground frame on the mounting surface.

10. The connector according to claim 1, wherein the contact has a contact side soldered portion extending to outside of the insulator, the contact side soldered portion being to be bonded by soldering to the mounting surface of the mounting object.

11. The connector according to claim 1, wherein the contact has a contact side spring portion provided to press the contact portion onto the connection end of the connection target housed in the connection target housing portion.

12. The connector according to claim 11, wherein the cover member has an opening at a place to be located above the contact portion when the cover member is in the closed position, such that the cover member is not brought into contact with the contact portion.

13. The connector according to claim 1, wherein the cover member has a cover member side spring portion provided to press the connection end of the connection target housed in the connection target housing portion onto the contact portion of the contact.

14. The connector according to claim 1, wherein the cover member has a ceiling portion that covers at least a part of the contact when the cover member is in the closed position.

* * * * *